(12) United States Patent
Kim et al.

(10) Patent No.: US 11,981,775 B2
(45) Date of Patent: May 14, 2024

(54) BRANCHED COPOLYMER, AND PHOTOSENSITIVE RESIN COMPOSITION, PHOTOSENSITIVE RESIN FILM AND OPTICAL DEVICE USING THE SAME

(71) Applicant: LG CHEM, LTD., Seoul (KR)

(72) Inventors: Bethy Kim, Daejeon (KR); Da Jung Kim, Daejeon (KR); Young Jee Song, Daejeon (KR); Dongmin Jeong, Daejeon (KR)

(73) Assignee: LG CHEM, LTD., Seoul (KR)

( * ) Notice: Subject to any disclaimer, the term of this patent is extended or adjusted under 35 U.S.C. 154(b) by 848 days.

(21) Appl. No.: 16/633,782

(22) PCT Filed: Jun. 5, 2019

(86) PCT No.: PCT/KR2019/006822
§ 371 (c)(1),
(2) Date: Jan. 24, 2020

(87) PCT Pub. No.: WO2019/245200
PCT Pub. Date: Dec. 26, 2019

(65) Prior Publication Data
US 2020/0207918 A1    Jul. 2, 2020

(30) Foreign Application Priority Data
Jun. 21, 2018   (KR) ........................ 10-2018-0071580

(51) Int. Cl.
*C08G 73/14*      (2006.01)
*C08G 73/10*      (2006.01)
(Continued)

(52) U.S. Cl.
CPC .......... *C08G 73/14* (2013.01); *C08G 73/101* (2013.01); *C08G 73/106* (2013.01); *G02B 1/04* (2013.01); *G03F 7/0387* (2013.01)

(58) Field of Classification Search
None
See application file for complete search history.

(56) References Cited

U.S. PATENT DOCUMENTS

| 4,358,581 A * | 11/1982 | Sutton, Jr. .......... | C08G 73/1028 528/229 |
| 2009/0061096 A1* | 3/2009 | Praserthdam ...... | C08G 73/1042 427/340 |

(Continued)

FOREIGN PATENT DOCUMENTS

| CN | 1067436 A | 12/1992 |
| CN | 101151579 A | 3/2008 |

(Continued)

OTHER PUBLICATIONS

Machine translation of Sugiura et al (JP S61231029) (Year: NA).*

(Continued)

*Primary Examiner* — Rachel Kahn
(74) *Attorney, Agent, or Firm* — ROTHWELL, FIGG, ERNST & MANBECK, P.C.

(57) ABSTRACT

The present invention relates to a branched copolymer having a polyimide polymer block bonded to each terminal of a branched polyamide functional group, and a photosensitive resin composition including the same, a photosensitive resin film, and an optical device.

12 Claims, 2 Drawing Sheets

(51) Int. Cl.
*G02B 1/04* (2006.01)
*G03F 7/038* (2006.01)

(56) References Cited

U.S. PATENT DOCUMENTS

| | | | |
|---|---|---|---|
| 2009/0202786 | A1 | 8/2009 | Tokuhisa et al. |
| 2010/0228002 | A1 | 9/2010 | Sohn et al. |
| 2014/0137734 | A1 | 5/2014 | Liu et al. |
| 2016/0018733 | A1 | 1/2016 | Lin et al. |
| 2017/0309844 | A1* | 10/2017 | Saeki ............... H01L 51/003 |
| 2018/0355110 | A1 | 12/2018 | Kim et al. |

FOREIGN PATENT DOCUMENTS

| | | | |
|---|---|---|---|
| CN | 101497695 A | | 8/2009 |
| JP | S61-231029 A | | 10/1986 |
| JP | H03-192123 A | | 8/1991 |
| JP | H03-210363 A | | 9/1991 |
| JP | 2000-221677 A | | 8/2000 |
| JP | 2003-176355 A | | 6/2003 |
| JP | 2004-198678 A | | 7/2004 |
| JP | 2007-094011 A | | 4/2007 |
| JP | 2011-123277 A | | 6/2011 |
| JP | 2017-048156 A | | 3/2017 |
| KR | 10-2010-0100505 A | | 9/2010 |
| KR | 10-1524195 B1 | | 5/2015 |
| KR | 10-2015-0080620 A | | 7/2015 |
| KR | 10-2016-0004468 A | | 1/2016 |
| KR | 10-2016-0059097 A | | 5/2016 |
| KR | 10-2017-0032726 A | | 3/2017 |
| KR | 10-2017-0055826 A | | 5/2017 |
| WO | 2006-109514 A1 | | 10/2006 |
| WO | 2008-114797 A1 | | 9/2008 |
| WO | 2013-047873 A1 | | 4/2013 |
| WO | WO-2016052323 A1 * | 4/2016 | ............... B05D 7/04 |
| WO | WO-2016109354 A1 * | 7/2016 | ......... C08G 73/1032 |
| WO | 2018-052221 A1 | | 3/2018 |
| WO | 2018-080056 A1 | | 5/2018 |

OTHER PUBLICATIONS

Machine translation of Jeon et al (KR 20160059097) (Year: NA).*
International Search Report and Written Opinion issued for PCT/KR2019/006822 dated Oct. 1, 2019, 10 pages.
Meador, et al., "Polyimide Aerogels with Amide Cross-Links: A Low Cost Alternative for Mechanically Strong Polymer Aerogels", ACS applied materials & interfaces, 2015, vol. 7, No. 2, pp. 1240-1249.
Feng, et al., "Synthesis of Hyperbranched Aromatic Polyamide-Imide and Its Grafting onto Multiwalled Carbon Nanotubes", Journal of Applied Polymer Science, vol. 106, pp. 2413-2421 (2007).

* cited by examiner

[FIG. 1]
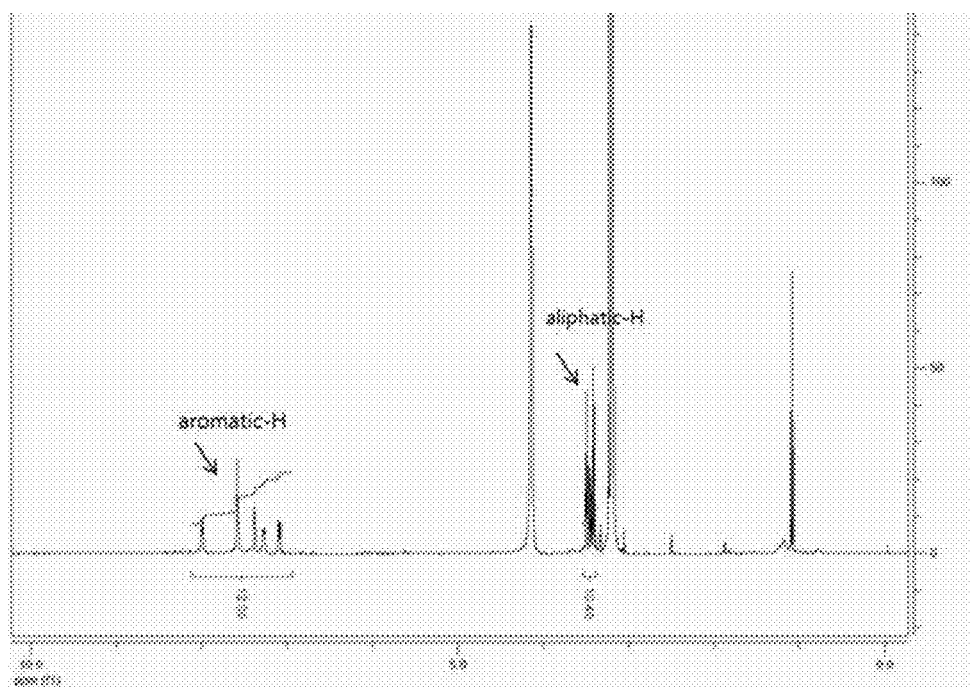

[FIG. 2]
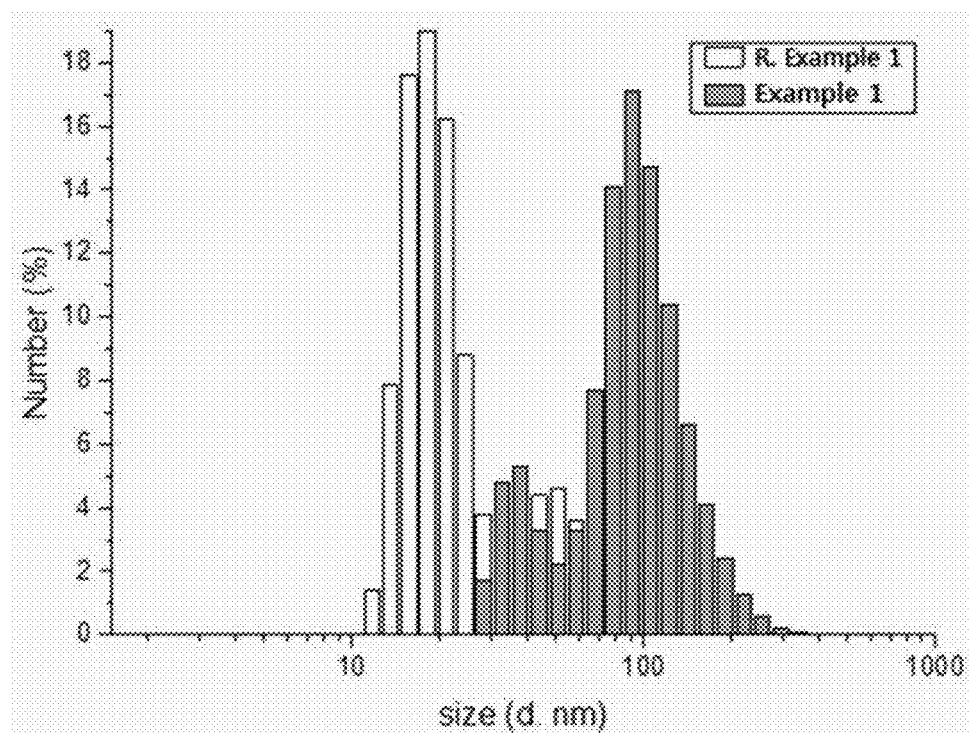

BRANCHED COPOLYMER, AND PHOTOSENSITIVE RESIN COMPOSITION, PHOTOSENSITIVE RESIN FILM AND OPTICAL DEVICE USING THE SAME

CROSS-REFERENCE TO RELATED APPLICATION(S)

This application is a 35 U.S.C. § 371 National Phase Entry Application from PCT/KR2019/006822, filed on Jun. 5, 2019, and designating the United States, which claims the benefit of the filing date of Korean Patent Application No. 10-2018-0071580 filed with Korean Intellectual Property Office on Jun. 21, 2018, the entire contents of which are incorporated herein by reference.

Technical Field

The present invention relates to a branched copolymer which can be cured at a low temperature, has excellent adhesive strength and mechanical properties, and can realize good insulation properties and patterning properties, a photosensitive resin composition, a photosensitive resin film, and an optical device using the same.

Background Art

An aromatic polyimide resin is a polymer mostly having an amorphous structure, and exhibits excellent heat resistance, chemical resistance, electrical properties, and dimensional stability due to its rigid chain structure. Such a polyimide resin is widely used as an electrical/electronic material.

However, the polyimide resin has many limitations in use, because it is dark brown due to the formation of a CTC (charge transfer complex) of d electrons present in the imide chain.

In order to solve the limitations and obtain a colorless transparent polyimide resin, a method of restricting the movement of the d electrons by introducing a strong electron withdrawing group such as a trifluoromethyl (—$CF_3$) group; a method of reducing the formation of the CTC by introducing a sulfone (—$SO_2$—) group, an ether (—O—) group, or the like into the main chain to make a bent structure; or a method of inhibiting the formation of the resonance structure of the d electrons by introducing an aliphatic cyclic compound, have been proposed.

However, it is difficult for the polyimide resin according to the aforementioned proposals to exhibit sufficient heat resistance due to the bending structure or the aliphatic cyclic compound, and a film produced using the same still has limitations such as poor mechanical properties.

Recently, in order to improve the mechanical properties of a polyimide, a poly(amide-imide) copolymer having an introduced amide unit structure in the polyimide resin has been developed. The amide unit structure imparts a large crystallinity to the copolymer, thereby enabling the expression of scratch resistance at a level that can replace glass as a material for displays and window covers of various electronic devices.

Therefore, there is a need to develop a novel resin having improved adhesiveness, insulation property, patterning property, and the like for application to various optical devices as well as improving the mechanical properties of the polyimide resin.

DETAILED DESCRIPTION OF THE INVENTION

The present invention provides a branched copolymer which can be cured at a low temperature, has excellent adhesive strength and mechanical properties, and can realize good insulation and patterning properties.

The present invention also provides a photosensitive resin composition, a photosensitive resin film, and an optical device using the above-mentioned branched copolymer.

In an aspect of the invention, a branched copolymer including a branched amide functional group represented by the following Chemical Formula 1; and a polyimide block bonded to the terminal of the branched amide functional group, are provided.

[Chemical Formula 1]

In Chemical Formula 1, A is a trivalent or higher-valent functional group, a is an integer of 3 or more, and $L_1$ is one of a direct bond or a divalent functional group.

In another aspect of the invention, a photosensitive resin composition including the above-mentioned branched copolymer is provided.

In still another aspect of the invention, a photosensitive resin film including a cured product of the photosensitive resin composition is provided.

In a further aspect of the invention, an optical device including the above-mentioned photosensitive resin film is provided.

Hereinafter, a branched copolymer according to specific embodiments of the present invention, a photosensitive resin composition, a photosensitive resin film, and an optical device using the same will be described in more detail.

Unless defined otherwise herein, the following terms may be defined as follows.

In the present specification, a description of a certain part "including" or "comprising" certain constituents means being capable of further including other constituents, and does not exclude the presence or addition of other constituents unless particularly stated to the contrary.

In the present specification, the term "substituted" means that other functional groups instead of a hydrogen atom in the compound are bonded, and a position to be substituted is not limited as long as it is a position at which the hydrogen atom is substituted, that is, a position at which it is substitutable with the substituent. When two or more substituents are substituted, the two or more substituents may be the same as or different from each other.

As used herein, the term "substituted or unsubstituted" means being unsubstituted or substituted with one or more substituents selected from the group consisting of deuterium; a halogen group; a cyano group; a nitro group; a hydroxy group; a carbonyl group; an ester group; an imide group; an amide group; a primary amino group; a carboxy group; a sulfonic acid group; a sulfonamide group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkoxysilylalkyl group; an arylphosphine group; or a heterocyclic group containing at least one of N, O, and S atoms, or being unsubstituted or substituted with a substituent to which two or more substituents are linked among the substituents exemplified above. For example, "the substituent to which two or more substituents are linked" may be a biphenyl group. That is, the biphenyl group may also be an aryl group, and may be interpreted as a substituent to which two phenyl groups are linked.

In the present specification, the notation

or ---* means a bond linked to another substituent group, and a direct bond means the case where no other atoms exist in the parts represented as L.

In the present specification, an alkyl group is a monovalent functional group derived from an alkane, and may be a straight chain or a branched chain. The number of carbon atoms of the straight chain alkyl group is not particularly limited, but is preferably 1 to 20. Also, the number of carbon atoms of the branched chain alkyl group is 3 to 20. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, iso-pentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, 2,6-dimethylheptane-4-yl and the like, but are not limited thereto. The alkyl group may be substituted or unsubstituted.

In the present specification, an alkylene group is a bivalent functional group derived from an alkane, and the description of the alkyl group as defined above may be applied except that they are divalent functional groups. For example, the alkylene group is a straight chain or a branched chain, and may include a methylene group, an ethylene group, a propylene group, an isobutylene group, a sec-butylene group, a tert-butylene group, a pentylene group, a hexylene group, or the like. The alkylene group may be substituted or unsubstituted.

In the present specification, a haloalkyl group means a functional group in which the alkyl group described above is substituted with a halogen, and examples of the halogen group include fluorine, chlorine, bromine, or iodine. The haloalkyl group may be substituted or unsubstituted. A specific example of the haloalkyl group may be a trifluoromethyl group ($-CF_3$).

In the present specification, a multivalent functional group is a residue in which a plurality of hydrogen atoms bonding to an arbitrary compound are removed, and for example, it may be a divalent functional group, a trivalent functional group, or a tetravalent functional group. As an example, a tetravalent functional group derived from an amide compound means a residue in which any four hydrogen atoms bonded to the amide compound are removed.

In the present specification, a direct bond or a single bond means being connected to a bond line in which no atoms or atomic groups exist at the corresponding position. Specifically, it means the case where no other atoms exist in the parts represented as $L_1$ and $L_2$ in Chemical Formula.

In the present specification, the weight average molecular weight or the number average molecular weight means a weight average molecular weight or a number average molecular weight in terms of polystyrene measured by the GPC method. In the process of determining the weight average molecular weight or the number average molecular weight in terms of polystyrene measured by the GPC method, a commonly known analyzing device, a detector such as a refractive index detector, and an analytical column can be used. Commonly applied conditions for temperature, solvent, and flow rate can be used. Specific examples of the measurement conditions include a temperature of 30° C., a chloroform solvent, and a flow rate of 1 mL/min.

1. Branched Copolymer

According to one embodiment of the present invention, a branched copolymer including a branched amide functional group represented by Chemical Formula 1; and a polyimide block bonded to the terminal of the branched amide functional group, may be provided.

The present inventors found through experiments that as shown in Chemical Formula 1, by including, as a core, a branched functional group containing three or more amide functional groups, and by using a copolymer having a specific branch structure in which polyimide blocks are respectively formed at three or more terminals of the branched core functional group, excellent curing performance, adhesion performance, and mechanical properties can be realized, the insulating property of the film obtained using the copolymer is improved, and the formation of positive or negative patterns is also easy. The present invention has been completed on the basis of these findings.

In particular, as a branched functional group containing three or more amide functional groups is introduced as a core through the reaction of adding an excess amount of a diamine monomer relative to the number of moles of the tetracarboxylic dianhydride monomer, the crystallinity can be imparted through a large number of amide bonds contained in the branched amide functional group, thereby realizing excellent mechanical properties compared to a polyimide polymer simply including a polyimide unit structure.

Further, as shown in Chemical Formula 1, as the branched amide functional group contains three or more amide functional groups in multiple branched forms, the surface area capable of reacting in the copolymer is increased and the crosslinked structure of the three-dimensional network structure can be formed more easily, thus realizing excellent mechanical properties. In addition, the pattern can be easily formed by exposure and chemical etching, and thus can be easily applied to various optical devices.

Moreover, the branched amide functional group bonds via a higher aliphatic chain or a polysiloxane chain rather than direct bonding of an amide bond and a polyimide block, thereby allowing the branched copolymer to have appropriate elasticity. Consequently, the branched copolymers exhibit high tensile elongation and elastic modulus characteristics and reduce the load generated at the time of elongation, and thus, the physical properties of the film do not change significantly even after a specific heat treatment process. Further, it is possible to suppress the structural change due to the crystallization of the film and the like, and to realize excellent durability which prevents the molded article produced from the copolymer from easily breaking.

In addition, the polyimide block bonded to the terminal of the branched amide functional group contains a large number of crosslinking functional groups, which can induce the crosslinking of the copolymer even at a relatively low temperature to proceed with the curing, and finally, a cured product having a high crosslinking density can be obtained. Thus, the film containing the cured product of the branched copolymer has excellent durability and insulation characteristics, and is thus easily applicable to various optical devices.

Specifically, the branched copolymer of one embodiment may include a branched amide functional group represented by Chemical Formula 1 above. The branched amide functional group has a branched form and may contain at least one, preferably three or more, amide bonds within the functional group.

Crystallinity can be imparted through a plurality of amide bonds contained in the branched amide functional group, thus realizing excellent mechanical properties compared to a polyimide polymer simply containing a polyimide unit structure.

In Chemical Formula 1, A is trivalent or higher-valent, or trivalent to pentavalent functional group, a is an integer of 3 or more, or 3 to 5, and $L_1$ is one of a direct bond or a divalent functional group.

The A is a polyvalent functional group located at the center of the branched amide functional group, and a functional group represented by parentheses "( )" in Chemical Formula 1 can be bonded by the number of a to the terminal of A. That is, in Chemical Formula 1, when a is 3, A is a trifunctional group. Also, when a is 4, A is a tetravalent functional group. Further, when a is 5, A is a pentavalent functional group.

When explanation is made by enumerating concrete examples, in Chemical Formula 1, when A is a tetravalent functional group and a is an integer of 4, it may be a functional group represented by the following Chemical Formula 1-1.

[Chemical Formula 1-1]

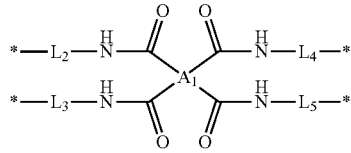

In Chemical Formula 1-1, $A_1$ is a tetravalent functional group, and $L_2$ to $L_5$ are the same as or different from each other, and are each independently one of a direct bond or a divalent functional group.

As the branched amide functional group contains three or more amide functional groups in multiple branched forms, the surface area capable of reacting in the copolymer is increased and the crosslinked structure of the three-dimensional network structure can be formed more easily, thus realizing excellent mechanical properties. In addition, the pattern can be easily formed by exposure and chemical etching, and thus can be easily applied to various optical devices.

The bivalent functional group used in $L_1$ of Chemical Formula 1 may be a functional group derived from a diamine compound used in the synthesis of the branched amide functional group. Specifically, in Chemical Formula 1, the bivalent functional group of $L_1$ may be an alkylene group having 5 to 100 carbon atoms; or a polysiloxanylene group having 5 to 100 carbon atoms. Considering that a polyimide block is bonded to the terminal of $L_1$ in Chemical Formula 1, the branched amide functional group bonds via a higher aliphatic chain or a polysiloxane chain rather than direct bonding of an amide bond and a polyimide block, thereby allowing the branched copolymer to have appropriate elasticity.

Specifically, examples of the alkylene group having 5 to 100 carbon atoms include 9, 10-dioctylnonadecane-1,19-diyl.

Further, examples of the polysiloxanylene group having 5 to 100 carbon atoms include a polydimethylsiloxanylene group represented by the following Chemical Formula 1-2.

[Chemical Formula 1-2]

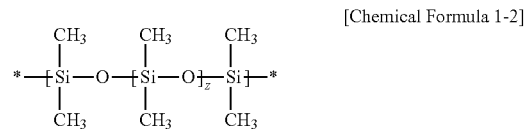

In Chemical Formula 1-2, Z is an integer of 1 to 10,000.

The polysiloxanylene group having 5 to 100 carbon atoms may have a number average molecular weight of 100 g/mol to 1000 g/mol, 200 g/mol to 800 g/mol, 400 g/mol to 500 g/mol, or 420 g/mol to 440 g/mol.

Meanwhile, A in Chemical Formula 1 or $A_1$ in Chemical Formula 1-1 may be a functional group derived from a tetracarboxylic acid dianhydride compound used in the synthesis of the branched amide functional group. That is, in Chemical Formula 1, A may be one of organic groups represented by the following Chemical Formula 2. Further, in Chemical Formula 1-1, $A_1$ may be an organic group represented by the following Chemical Formula 2.

[Chemical Formula 2]

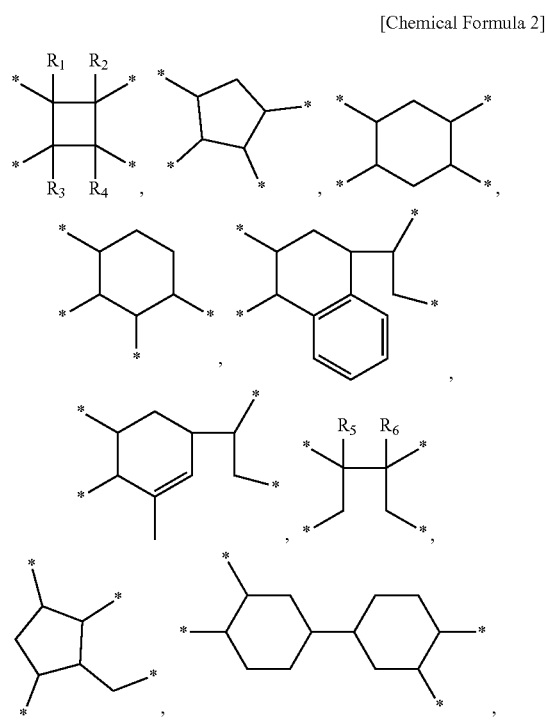

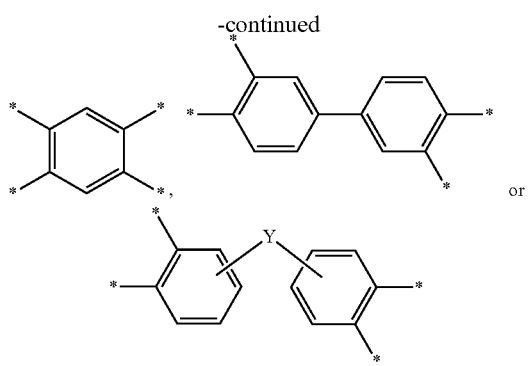

In Chemical Formula 2, Y is any one selected from the group consisting of a direct bond, —O—, —CO—, —COO—, —S—, —SO—, —SO$_2$—, —CR$_7$R$_8$—, —(CH$_2$)$_t$—, —O(CH$_2$)$_t$O—, —COO (CH$_2$)$_t$OCO—, —CONH—, phenylene, or a combination thereof, wherein R$_1$ to R$_8$ are each independently hydrogen, or an alkyl group or a haloalkyl group having 1 to 10 carbon atoms, and t is an integer of 1 to 10.

More preferably, A in Chemical Formula 1 and A$_1$ in Chemical Formula 1-1 may be an organic, group of Chemical Formula 2-1 derived from 4,4'-oxydiphthalic anhydride, or an organic group of Chemical Formula 2-2 derived from pyromellitic dianhydride.

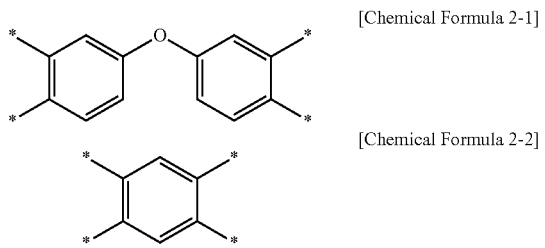

[Chemical Formula 2-1]

[Chemical Formula 2-2]

Further, the branched copolymer of one embodiment may include a polyimide block bound to the terminal of the branched amide functional group. The polyimide block refers to an oligomer or polymer chain composed of a plurality of polyimide repeating units, and may be bonded to the terminal ( —————* )of the branched amide functional group of Chemical Formula 1. More specifically, the nitrogen atom contained in the imide functional group in the polyimide block can be bonded to the terminal ( —————* ) of the branched amide functional group of Chemical Formula 1.

The polyimide block mostly has an amorphous structure, and can exhibit excellent heat resistance, chemical resistance, electrical properties, and dimensional stability due to its rigid chain structure. The polyimide block may include a crosslinking functional group bonded to a polyimide backbone or branched chain. In this way, it can induce the crosslinking of the copolymer even at a relatively low temperature to proceed with the curing, and finally, a cured product having a high crosslinking density can be obtained. Thus, the film containing a cured product of the branched copolymer has excellent durability and insulation characteristics, and is thus easily applicable to various optical devices.

Examples of the crosslinking functional groups are not particularly limited, and crosslinking functional groups for forming various crosslinks widely used in the technical field for forming crosslinked products or cured products can be used without limitation. Examples of the crosslinking functional group include at least one selected from the group consisting of a hydroxyl group, a thiol group, a silanol group, an amino group, a carboxyl group, an acid anhydride group, an isocyanate group, an acyl halide group, a vinyl group, and an epoxy group. In particular, a hydroxy group can be preferably used as the crosslinking functional group. In this case, the crosslinking between the hydroxyl groups may be performed at a relatively low temperature of 250° C. or less, 220° C. or less, 180° C. to 250° C., or 190° C. to 220° C.

That is, the crosslinking functional group may be a hydroxyl group, a thiol group, a silanol group, an amino group, a carboxyl group, an acid anhydride group, an isocyanate group, an acyl halide group, a vinyl group, an epoxy group, or a mixture of two or more thereof.

The crosslinking functional group may be contained in an amount of 5% to 50% by weight, 10% to 40% by weight, or 25% to 30% by weight based on the total weight of the branched copolymer. When the content of the crosslinking functional group is too low, i.e., less than 5% by weight based on the total weight of the branched copolymer, crosslinking of the copolymer is not sufficiently induced even at a low temperature, making it difficult to secure a sufficient level of crosslinking density, and the film containing the cured product of the branched copolymer may have reduced durability and insulation properties.

Meanwhile, when the content of the crosslinking functional group is too high, i.e., greater than 50% by weight based on the total weight of the branched copolymer, the crosslinking density of the branched copolymers is excessively increased and thereby the modulus or degree of crystallization excessively increases, and it may be difficult to secure a desired elasticity or elastic recovery rate.

Specifically, the polyimide block may include a polyimide repeating unit represented by the following Chemical Formula 3.

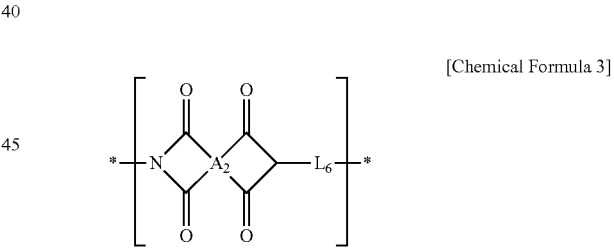

[Chemical Formula 3]

In Chemical Formula 3, A$_2$ is a tetravalent functional group, and L$_6$ is a divalent functional group substituted by a haloalkyl group and a crosslinking functional group.

The A$_2$ in Chemical Formula 3 may be a functional group derived from a tetracarboxylic acid dianhydride compound used in the synthesis of the polyimide block. That is, in Chemical Formula 3, A$_2$ may be one of the organic groups represented by Chemical Formula 2.

Meanwhile, the L$_6$ is a functional group derived from a diamine compound used in the synthesis of a polyimide block. In Chemical Formula 3, L$_6$ may be a divalent group substituted by a haloalkyl group and a crosslinking functional group.

In the L$_6$, a trifluoromethyl group may be used as the haloalkyl group. By introducing a strong electron-withdrawing group such as a trifluoromethyl (—CF$_3$) group to limit the transfer of π electrons, it is possible to suppress the formation of a charge transfer complex (CTC) of π E electrons present in the imide chain of the polyimide block, thereby forming colorless transparent polyimide blocks.

As the crosslinking functional group in the $L_6$, crosslinking functional groups for forming various crosslinks widely used in the technical field for forming crosslinked products or cured products can be used without limitation. Examples of the crosslinking functional group include at least one selected from the group consisting of a hydroxyl group, a thiol group, a silanol group, an amino group, a carboxyl group, an acid anhydride group, an isocyanate group, an acyl halide group, a vinyl group, and an epoxy group. In particular, a hydroxy group can be preferably used as the crosslinking functional group. In this case, the crosslinking between the hydroxyl groups may be performed at a relatively low temperature of 250° C. or less, 220° C. or less, 180° C. to 250° C., or 190° C. to 220° C.

As a specific example, in Chemical Formula 3, $L_6$ may be a functional group represented by the following Chemical Formula 4.

[Chemical Formula 4]

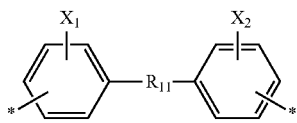

In Chemical Formula 4, $R_{11}$ is an alkylene group substituted with a haloalkyl group, at least one of $X_1$ and $X_2$ is a crosslinking functional group, and the remainder is hydrogen. Preferably, in Chemical Formula 4, $R_{11}$ is a ditrifluoromethyl methylene group (—$C(CF_3)_2$—), and $X_1$ and $X_2$ are each independently a hydroxy group. More preferably, it may be the following Chemical Formula 4-1 which is a divalent functional group derived from 2,2-bis(3-amino-4-hydroxyphenyl)hexafluoropropane.

[Chemical Formula 4-1]

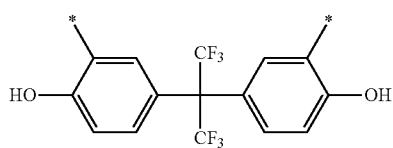

More specifically, the branched copolymer of one embodiment may include a copolymer represented by the following Chemical Formula 5 or a copolymer represented by the following Chemical Formula 6.

[Chemical Formula 5]

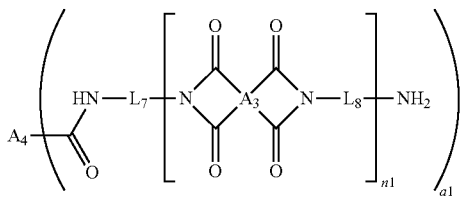

[Chemical Formula 6]

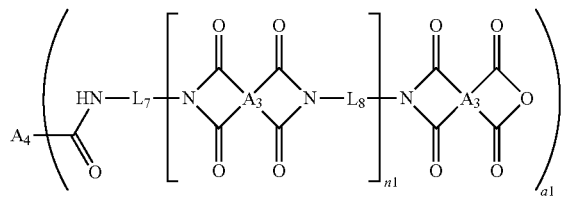

In Chemical Formulae 5 and 6, $A_4$ is a trivalent or higher group, or a trivalent to pentavalent functional group, a1 is an integer of 3 or more, or 3 to 5, $L_7$ is a divalent functional group, $A_3$ is a tetravalent group, $L_8$ is a divalent functional group substituted by a haloalkyl group and a crosslinking functional group, and n1 is an integer of 1 to 10,000, 10 to 10,000, 50 to 10,000, or 100 to 10,000.

Specifically, $A_4$ in Chemical Formulae 5 and 6 is the same as A in Chemical Formula 1, $L_7$ in Chemical Formulas 5 and 6 is the same as $L_1$ in Chemical Formula 1, $A_3$ in Chemical Formulas 5 and 6 is the same as $A_2$ in Chemical Formula 3, and $L_8$ in Chemical Formulas 5 and 6 is the same as $L_6$ in Chemical Formula 3.

The copolymer represented by Chemical Formula 5 can be obtained by adding a larger molar amount of the diamine compound than in the molar amount of the tetracarboxylic acid anhydride compound among the diamine compound and the tetracarboxylic acid dianhydride compound which are reaction monomers used in the synthesis of the polyimide block.

The copolymer represented by Chemical Formula 6 can be obtained by adding a larger molar content of the tetracarboxylic acid anhydride compound than in the molar content of the diamine compound, among the diamine compound and the tetracarboxylic acid dianhydride compound which are reaction monomers used in the synthesis of the polyimide block.

The branched copolymers may have a weight average molecular weight of 1000 g/mol to 1,000,000 g/mol, 2000 g/mol to 500,000 g/mol, or 3000 g/mol to 100,000 g/mol. Further, the branched copolymers may have a number average molecular weight of 100 of to 100,000 g/mol, 500 g/mol to 50,000 g/mol, or 1000 g/mol to 16,000 g/mol.

Thus, the polymerization reaction of the branched copolymer can be stably performed, and sufficient mechanical properties can be ensured. When the molecular weight of the branched copolymer is excessively reduced, it may be difficult for the film produced therefrom to secure sufficient mechanical properties and adhesiveness. When the molecular weight of the copolymer is excessively increased, the modulus or the degree of crystallinity of the branched copolymer may excessively increase, and it may be difficult to secure a desired elasticity or elastic recovery rate.

As a method for preparing the branched copolymer of one embodiment, a method including: a first step of reacting a first diamine compound and a polycarboxylic acid anhydride compound; and a second step of reacting the reaction product of the first step, a second diamine compound and a polycarboxylic acid anhydride, wherein in the first step, the polycarboxylic acid anhydride compound is reacted in an amount of 0.5 mol or less based on 1 mol of the first diamine compound, may be mentioned.

More specifically, in the first step, when the polycarboxylic acid anhydride compound is reacted in an amount of 0.5 mol or less, 0.3 mol or less, 0.01 mol to 0.5 mol, 0.01 mol to 0.3 mol, or 0.02 mol to 0.3 mol, based on 1 mol of the first diamine compound, as a relatively large amount of the first diamine compound is added, the acid anhydride group present in the polycarboxylic acid anhydride reacts with the amino group of the first diamine to produce an antic acid compound, and then the carboxyl group present in the amic acid compound may react again with the amino group of the first amidated diamine to synthesize a polyamide compound. The polyamide compound corresponds to a precursor compound containing the branched amide functional group of the embodiment.

In the first step, when the polycarboxylic acid anhydride compound is added in an amount of more than 0.5 mol based on 1 mol of the first diamine compound, the transition from an amic acid compound to a polyamide compound does not sufficiently proceed, making it difficult to form a branched amide functional group as in the one embodiment.

Subsequently, the terminal amino group of the polyamide compound synthesized in the first step reacts with the second diamine compound and the polycarboxylic acid anhydride to form a polyamic acid, and then a polyimide block is formed through a ring-closing reaction.

Both the first step and the second step reaction may be performed at 100° C. to 200° C. or 140° C. to 160° C., respectively, and the reaction time may be adjusted within a range of 0.1 hours to 20 hours.

The first diamine compound may be a compound in which an amino group is bonded to both terminals of an alkylene group having 5 to 100 carbon atoms; or a compound in which an amino group is bonded to both terminals of a polysiloxanylene group having 5 to 100 carbon atoms. As a preferred example, 9,10-dioctylnonadecane-1, 19-diamine or polydimethylsiloxanyl diamine can be used.

The second diamine compound may be a compound in which an amino group is bonded to both terminals of a divalent functional group substituted by a haloalkyl group and a crosslinking functional group. As a preferable example, 2,2-bis(3-amino-4-hydroxyphenyl) hexafluoropropane can be used.

The first diamine compound may be added in an amount of 0.01 to 20 parts by weight, 0.1 to 18 parts by weight, or 0.5 to 17 parts by weight based on 100 parts by weight of the second diamine compound. As such, as the first diamine compound is added in a very small amount compared to the second diamine compound, the reaction product obtained in the first step reaction is a single compound (specifically, a polyamide compound containing a plurality of amide groups). In the second step reaction, a polyimide oligomer or a polymer block may be formed.

Examples of the polycarboxylic anhydride are not particularly limited, but tetracarboxylic acid dianhydride is preferable, and specifically, 4,4'-oxydiphthalic anhydride, pyromellitic dianhydride, or the like can be used.

In the second step, the polycarboxylic acid anhydride compound can be reacted in an amount of 0.8 mol to 1.2 mol, 0.9 mol to 1.1 mol, 0.8 mol to 0.99 mol, 0.9 mol to 0.99 mol, 1.01 mol to 1.2 mol, or 1.01 mol to 1.1 mol, based on 1 mol of the second diamine compound. When the polycarboxylic acid anhydride compound is reacted in an amount of 0.8 mol to 0.99 mol, or 0.9 mol to 0.99 mol, based on. 1 mol of the second diamine compound, an amine-terminated polyimide block as shown in Chemical Formula 5 may be formed. Further, when the polycarboxylic anhydride compound is reacted in an amount of 1.01 to 1.2 mol, or 1.01 to 1.1 mol based on 1 mol of the second diamine compound, an anhydride-terminated polyimide block as shown in Chemical Formula 6 may be formed.

The reaction of the first step or the second step may be performed in the presence of an organic solvent. Specific examples of the organic solvent include toluene, tetrahydrofuran, N,N-dimethylformamide, N,N-dimethylacetamide, N-methyl-2-pyrrolidone, N-methylcaprolactam, 2-pyrrolidone, N-ethylpyrrolidone, N-vinylpyrrolidone, dimethyl sulfoxide, tetramethylurea, pyridine, dimethyl sulfone, hexamethyl sulfoxide, γ-butyrolactone, 3-methoxy-N,N-dimethylpropanamide, 3-ethoxy-N, N-dimethylpropanamide, 3-butoxy-N,N-dimethylpropanamide, 1,3-dimethyl-imidazolidinone, ethyl amyl ketone, methyl nonyl ketone, methyl ethyl ketone, methyl isoamyl ketone, methyl isopropyl ketone, cyclohexanone, ethylene carbonate, propylene carbonate, diglyme, 4-hydroxy-4-methyl-2-pentanone, ethylene glycol monomethyl ether, ethylene glycol monomethyl ether acetate, ethylene glycol monoethyl ether, ethylene glycol monoethyl ether acetate, ethylene glycol monopropyl ether, ethylene glycol monopropyl ether acetate, ethylene glycol monoisopropyl ether, ethylene glycol monoisopropyl ether acetate, ethylene glycol monobutyl ether, ethylene glycol monobutyl ether acetate, diethylene glycol methyl ethyl ether, and the like. They can be used alone or in combination of two or more.

II. Photosensitive Resin Composition

According to another embodiment of the present invention, a photosensitive resin composition including the branched copolymer of one embodiment can be provided. The details of the branched copolymer may include all those described above in the one embodiment.

The photosensitive resin composition may be one in which the branched copolymer of one embodiment is dissolved or dispersed in an organic solvent. Specific examples of the organic solvent include toluene, tetrahydrofuran, N,N-dimethylformamide, N,N-dimethylacetamide, N-methyl-2-pyrrolidone, N-methylcaprolactam, 2-pyrrolidone, N-ethylpyrrolidone, N-vinylpyrrolidone, dimethyl sulfoxide, tetramethylurea, pyridine, dimethyl sulfone, hexamethyl sulfoxide, γ-butyrolactone, 3-methoxy-N,N-dimethylpropanamide, 3-ethoxy-N,N-dimethylpropanamide, 3-butoxy-N,N-dimethylpropanamide, 1,3-dimethyl-imidazolidinone, ethyl amyl ketone, methyl nonyl ketone, methyl ethyl ketone, methyl isoamyl ketone, methyl isopropyl ketone, cyclohexanone, ethylene carbonate, propylene carbonate, diglyme, 4-hydroxy-4-methyl-2-pentanone, ethylene glycol monomethyl ether, ethylene glycol monomethyl ether acetate, ethylene glycol monoethyl ether, ethylene glycol monoethyl ether acetate, ethylene glycol monopropyl ether, ethylene glycol monopropyl ether acetate, ethylene glycol monoisopropyl ether, ethylene glycol monoisopropyl ether acetate, ethylene glycol monobutyl ether, ethylene glycol monobutyl ether acetate, diethylene glycol methyl ethyl ether, and the like. They can be used alone or in combination of two or more.

The solid content of the photosensitive resin composition may be 10% to 50% by weight, 20% to 40% by weight, or 25% to 35% by weight based on the total weight of the photosensitive resin composition.

In addition, the photosensitive resin composition may further include other components in addition to the branched copolymer of one embodiment and the organic solvent. In a non-limiting example, when the photosensitive resin composition is coated, additives capable of improving the uniformity of the thickness of a film and the surface smoothness, improving the adhesion between a film and a substrate, changing the dielectric constant and conductivity of a film, or increasing the denseness of a film may be further included. Examples of these additives include various kinds of solvents, coloring materials, inorganic fillers, surfactants, silane-based compounds, dielectrics, crosslinking compounds, and the like. The addition amount thereof is not particularly limited, and can be freely adjusted within the range of 0.1% by weight to 50% by weight based on the total weight of the photosensitive resin composition.

III. Photosensitive Resin Film

According to another embodiment of the present invention, a photosensitive resin film including a cured product of the photosensitive resin composition of the other embodiment can be provided. Specifically, the cured product means a material obtained through a curing process of the photosensitive resin composition of the other embodiment. In the curing step of the photosensitive resin composition, the crosslinking reaction of the branched copolymer of one embodiment proceeds. That is, the cured product of the photosensitive resin composition of the other embodiment may include a crosslinked product of the branched copolymer of the one embodiment.

The heat-curing temperature of the photosensitive resin film may be 250° C. or less, 180° C. to 250° C., or 190° C. to 220° C. Specifically, the crosslinking functional group contained in the polyimide block of the branched copolymer of one embodiment may proceed with a crosslinking reaction at a temperature of 250° C. or less, 180° C. to 250° C., or 190° C. to 220° C. Thus, as the thermal deformation of the branched copolymer in the film or the thermal deformation of the film in the film forming process is minimized, a uniform shape and numerical value can be stably secured together with excellent physical properties in the finally obtained photosensitive resin film.

Specifically, the photosensitive resin film may have an ultimate tensile strength of 100 MPa or more, 100 MPa to 150 MPa, or 120 MPa to 145 MPa as measured according to the ASTM D882 Test Method. In addition, the photosensitive resin film has tensile elongation (%) of 2% or more, 2% to 10%, 5% to 10%, or 6% to 8% as measured according to the ASTM D 882 Test Method. Further, the photosensitive resin film has an elastic modulus (GPa) of 3 GPa or more, 3 GPa to 10 GPa, 3 GPa to 5 GPa, or 3.1 GPa to 3.6 GPa as measured according to the ASTM D 882 Test Method.

The thickness of the photosensitive resin film is not particularly limited, but can be freely adjusted within the range of, for example, 0.001 μm to 100 μm. When the thickness of the photosensitive resin film increases or decreases by a specific value, the physical properties measured by the photosensitive resin film can also change by a certain value.

Meanwhile, the photosensitive resin film may include an opening pattern. The opening pattern refers to a photosensitive resin film having micropores (holes) having a maximum diameter of 100 μm or less, and the micropores may be formed through selective exposure and development processes of the photosensitive resin film.

When the photosensitive resin film includes an opening pattern, it may become a connection channel (via hole) with another film when it is applied to an electronic device, an optical device, etc., and thus it can be used as an insulating film or the like.

Examples of the method of producing the photosensitive resin film are not particularly limited, but for example, the method may include the steps of: coating the photosensitive resin film of the other embodiment onto a substrate to form a coating film (step 1); drying the coating film (step 2); and heat-treating and curing the dried coating film (step 3).

Step 1 is a step of coating the photosensitive resin composition described above onto a substrate to form a coating film. The details of the photosensitive resin composition include all those described above in the other embodiment.

The method of coating the photosensitive resin composition onto the substrate is not particularly limited, but for example, methods such as spin coating, screen printing, offset printing, flexographic printing, inkjet, and the like can be used. A silicon wafer can be mentioned as an example of the substrate.

Step 2 is a step of drying the coating film formed by coating the photosensitive resin composition onto a substrate. The step of drying the coating film may be performed by a heating means such as a hot plate, a hot air circulating oven, an infrared oven, and the like, and the drying may be performed at a temperature of 50° C. to 150° C., or 100° C. to 150° C.

Step 3 is a step of heat-treating and curing the dried coating film. At this time, the heat treatment may be performed by a heating means such as a hot plate, a hot air circulating oven, an infrared oven, and the like, and the heat treatment may be performed at a temperature of 180° C. to 250° C., or 190° C. to 220° C. In the case of the photosensitive resin composition containing the branched copolymer of one embodiment, as the curing temperature by the heat treatment proceeds at a relatively low temperature of 250° C. or less, the thermal deformation of the branched copolymer is minimized, and thus a uniform shape and a numerical value can be stably secured together with excellent physical properties in the finally obtained film.

Meanwhile, if necessary, the method may further include exposing and developing the dried coating film prior to step 3. The opening pattern can be formed on the dried film through the exposure and development steps.

Examples of the method of exposing the coating film are not particularly limited, but for example, selective exposure can be performed through methods such as contacting a photomask having a predetermined pattern formed on the coating film and irradiating ultraviolet light, imaging a predetermined pattern contained in the mask through a projection objective lens and then irradiating ultraviolet light, or direct imaging using a laser diode as a light source and then irradiating ultraviolet light. At this time, as an example of ultraviolet irradiation conditions, irradiating with a light quantity of 5 mJ/cm$^2$ to 600 mJ/cm$^2$ may be mentioned.

As an example of the method of developing the coating film, a method of treating an alkaline developer may be mentioned. Examples of the alkaline developer are not particularly limited, but for example, it can be used by adjusting the concentration and temperature of an aqueous alkaline solution such as potassium hydroxide, sodium hydroxide, sodium carbonate, potassium carbonate, sodium phosphate, sodium silicate, ammonia, tetramethylammonium hydroxide, amines, and the like, and a commercially available alkaline developer can also be used.

The specific amount of the alkaline developer used is not particularly limited, but it is necessary to adjust the concentration and the time as as to not damage the coating film, and the developing can be performed in a 2.38 wt % tetramethylammonium hydroxide aqueous solution for 150 seconds.

IV. Optical Device

According to still another embodiment of the present invention, an optical device including the photosensitive resin film of the other embodiment can be provided.

The photosensitive resin film may be introduced into an optical device, an electric device, or the like by a known method. The photosensitive resin film is produced from the branched copolymer of one embodiment, and can realize excellent stability together with excellent physical properties. Thus, an optical device capable of exhibiting high reliability can be provided.

Advantageous Effects

According to the present invention, a branched copolymer which can be cured at a low temperature, has excellent adhesive strength and mechanical properties, and can realize good insulation properties and patterning properties, a method for producing a liquid crystal aligning film using the same, and a photosensitive resin composition, a photosensitive resin film, and an optical device using the same can be provided.

BRIEF DESCRIPTION OF DRAWINGS

FIG. 1 shows $^1$H NMR spectrum of the compound of Chemical Formula a synthesized in Example 1.
FIG. 2 shows the size distribution of copolymers obtained in Example 1 and Reference Example 1.

DETAILED DESCRIPTION OF THE EMBODIMENTS

Hereinafter, the present invention will be described in more detail by way of examples. However, these examples are for illustrative purposes only and are not intended to limit the scope of the present invention.

EXAMPLES

Example 1

A 250 mL flask equipped with a Dean-Stark apparatus was prepared, in which 0.33 g (0.64 mmol) of 9,10-dioctylnonadecane-1,19-diamine was dissolved in diethylene glycol methyl ethyl ether (MEDG), and then 0.05 g (0.16 mmol) of 4,4'-oxydiphthalic anhydride was added thereto. The mixture was reacted at 150° C. for 2 hours in a nitrogen atmosphere to synthesize a compound represented by the following Chemical Formula a.

[Chemcial Formula a]

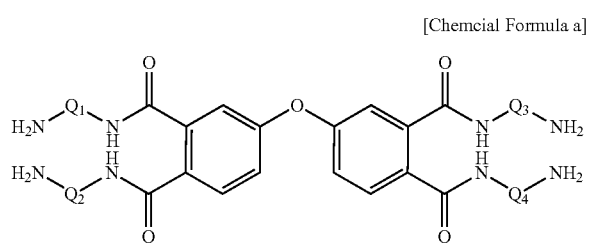

In Chemical Formula a, $Q_1$ to $Q_4$ are all 9,10-dioctylnonadecane-1,19-diyl. For reference, $^1$H NMR spectrum results of the compound represented by Chemical Formula a are shown in FIG. 1.
Then, 16.5 g (0.053 mol) of 4,4'-oxydiphthalic anhydride and 20 g (0.055 mol) of 2,2-bis(3-amino-4-hydroxyphenyl)hexafluoropropane were added to the compound represented by Chemical Formula a, and then diethylene glycol methyl ethyl ether (MEDG) and toluene were added so that the solid content was 30 wt %, and the mixture was reacted at 150° C. for 12 hours to synthesize a branched copolymer.

After completion of the reaction, 98.5 g of a photosensitive resin composition in which the branched copolymer was dissolved in the MEDG solvent was obtained. The molecular weight of the branched copolymer was measured by GPC using a THF solvent, and as a result, a number average molecular weight (Mn=3000 g/mol) and a weight average molecular weight (Mw=5500 g/mol) were found.

Example 2

A branched copolymer and a photosensitive resin composition were obtained in the same manner as in Example 1, except that a compound represented by the following Chemical Formula b was used instead of the compound represented by Chemical Formula a in Example 1.

[Chemical Formula b]

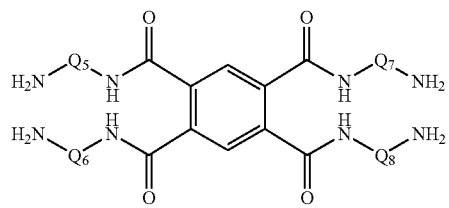

In Chemical Formula b, $Q_5$ to $Q_8$ are all 9,10-dioctylnonadecane-1,19-diyl.
A 250 mL flask equipped with a Dean-Stark apparatus was prepared, in which 0.48 g (0.92 mmol) of 9,10-dioctylnonadecane-1,19-diamine was dissolved in diethylene glycol methyl ethyl ether (MEDG), and then 0.05 g (0.22 mmol) of pyromellitic dianhydride was added thereto. The mixture was reacted at 150° C. for 2 hours in a nitrogen atmosphere to synthesize a compound represented by Chemical Formula b.
The molecular weight of the branched copolymer was measured by GPC using a THF solvent, and as a result, a number average molecular weight (Mn=1000 g/mol) and a weight average molecular weight (Mw=3000 g/mol) were found.

Example 3

A branched copolymer and a photosensitive resin composition were obtained in the same manner as in Example 1, except that 0.28 g (0.64 mmol) of polydimethylsiloxanyl diamine (Mn=430 g/mol) instead of 9,10-dioctylnonadecane-1, 19-diamine was dissolved in diethylene glycol methyl ethyl ether (MEDG), and then reacted with 0.05 g (0.16 mmol) of 4,4'-oxydiphthalic anhydride in Example 1. The molecular weight of the branched copolymer was measured by GPC using a THF solvent, and as a result, a number average molecular weight (Mn=5000 g/mol) and a weight average molecular weight (Mw=100,000 g/mol) were found.

Example 4

A branched copolymer and a photosensitive resin composition were obtained in the same manner as in Example 1, except that 3.3 g (6.4 mmol) of 9,10-dioctylnonadecane-1, 19-diamine was added and reacted in Example 1. The molecular weight of the branched copolymer was measured by GPC using a THF solvent, and as a result, a number average molecular weight (Mn=16,000 g/mol) and a weight average molecular weight (Mw=35,000 g/mol) were found.

COMPARATIVE EXAMPLE

Comparative Example 1

A branched copolymer and a photosensitive resin composition were obtained in the same manner as in Example 1, except that a compound represented by the following Chemical Formula c (1,3,5-triazine-2,4,6-triamine) was used instead of the compound represented by Chemical Formula a in Example 1.

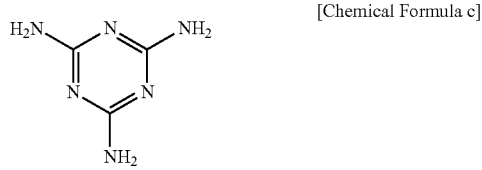

[Chemical Formula c]

REFERENCE EXAMPLE

Reference Example 1

A 250 mL flask equipped with a Dean-Stark apparatus was prepared, in which 0.3 g of 9,10-dioctylnonadecane-1,19-diamine, 16.9 g of 4,4'-oxydiphthalic anhydride, and 20 g of 2,2-bis(3-amino-4-hydroxyphenyl)hexafluoropropane were added to diethylene glycol methyl ethyl ether (MEDG) and toluene, and the mixture was reacted at 150° C. for 12 hours to obtain a linear polyimide copolymer. The molecular weight of the linear polyimide copolymer was measured by GPC using a THF solvent, and as a result, a number average molecular weight (Mn=25,000 g/mol) and a weight average molecular weight (Mw=32,000 g/mol) were found.

EXPERIMENTAL EXAMPLES

Experimental Example 1

The photosensitive resin compositions obtained in the examples and comparative examples above were coated onto a 4-inch silicon wafer using a spin coating method at 800 to 1200 rpm, and then dried at a temperature of 120° C. for 2 minutes to obtain a substrate on which a photosensitive resin film having a thickness of 5.0 μm was formed.

Then, the substrate was exposed to an energy of 500 mJ/cm$^2$ by a broadband aligner exposure apparatus using a mask having a fine pattern formed thereon. Thereafter, the exposed substrate was developed in a 2.38 wt % tetramethylammonium hydroxide aqueous solution for 150 seconds, washed with ultrapure water, and then dried under nitrogen to form a pattern on the photosensitive resin film. Then, the resultant was cured again at a temperature of 200° C. for 2 hours to obtain a substrate on which a patterned photosensitive resin film was formed.

The thus-obtained substrate on which a patterned photosensitive resin film was formed was immersed in a solvent selected from acetone, DMF, and GBL for 30 minutes, washed with isopropyl alcohol, and dried under nitrogen. Then, the surface condition of the patterned photosensitive resin film was grasped through a microscope, and the chemical resistance was evaluated under the following criteria, and the results are shown in Table 1 below.

Excellent: There is no damage like melted marks or cracks.

Defective: There is damage such as melted marks or cracks

TABLE 1

Measurement Results of Experimental Example 1 of Examples and Comparative Examples

| Category | Acetone | DMF | GBL |
| --- | --- | --- | --- |
| Example 1 | Excellent | Excellent | Excellent |
| Example 2 | Excellent | Excellent | Excellent |
| Example 3 | Excellent | Excellent | Excellent |
| Example 4 | Excellent | Excellent | Excellent |
| Comparative Example 1 | Defective | Defective | Defective |

As shown in Table 1, the photosensitive resin films obtained from the copolymers of Examples 1 to 4 containing a branched amide functional group exhibited excellent chemical resistance to all solvents of acetone, DMF, and GBL, whereas the photosensitive resin films obtained from the copolymers of Comparative Example 1 containing no amide functional group exhibited defective chemical resistance to all solvents of acetone, DMF, and GBL as compared with the examples.

Experimental Example 2

The photosensitive resin compositions obtained in the examples and comparative examples above were coated onto a 4-inch silicon wafer using a spin coating method at about 1000 rpm, and then dried at a temperature of 120° C. for about 2 minutes and cured at 200° C. for about 1 hour to obtain a photosensitive resin film having a thickness of 10 μm to 15 μm, and then the silicon wafer was removed to secure a photosensitive resin film.

With respect to the photosensitive resin film, the ultimate tensile strength (MPa), tensile elongation (%), and elastic modulus (GPa) were respectively measured according to the ASTM D 882 Test Method using a Universal testing machine. The measurement results are shown in Table 2 below.

TABLE 2

Measurement Results of Experimental Example 2 of Examples and Comparative Examples

| Category | Ultimate tensile strength (MPa) | Tensile elongation (%) | Elastic modulus (GPa) |
| --- | --- | --- | --- |
| Example 1 | 140 | 7.4 | 3.6 |
| Example 2 | 122 | 6.8 | 3.2 |
| Example 3 | 128 | 6.5 | 3.1 |
| Example 4 | 126 | 7.6 | 3.1 |
| Comparative Example 1 | 37 | 1.9 | 2.8 |

As shown in Table 2 above, the photosensitive resin films obtained from the copolymers of Examples 1 to 4 containing the branched amide functional group exhibited an ultimate tensile strength of 122 MPa to 140 MPa, tensile elongation of 6.5% to 7.6%, and an elastic modulus of 3.1 GPa to 3.6 GPa, thereby realizing excellent mechanical properties. On the other hand, the photosensitive resin film obtained from the copolymer of Comparative Example 1 containing no amide functional group exhibited an ultimate tensile strength of 37 MPa, tensile elongation of 1.9%, and an elastic modulus of 2.8 GPa, confirming that the mechanical properties were defective as compared with those of the examples.

Experimental Example 3

For the branched copolymer obtained in Example 1 and the linear copolymer obtained in Reference Example 1, the hydrodynamic size distribution of the copolymer was measured in solution phase with a dynamic light scattering (DLS) analyzer, and the results are shown in FIG. 2.

Looking at FIG. 2, in the case of the two-dimensional linear copolymer obtained in Reference Example 1, an average particle size was measured at 25 nm, whereas in the case of the branched copolymer obtained in Example 1, the average particle size which is larger than that of Reference Example 1 was measured at 100 nm, confirming that the copolymer of Example 1 has a branched three-dimensional structure.

The invention claimed is:

1. A branched copolymer comprising:
a branched amide functional group represented by Chemical Formula 1-1; and
a polyimide block bonded to a terminal of the branched amide functional group:

[Chemical Formula 1-1]

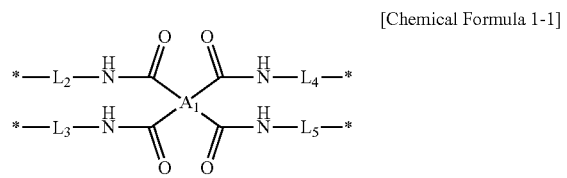

wherein, in the Chemical Formula 1,
$A_1$ is an organic group represented by Chemical Formula 2, and
$L_2$ to $L_5$ are the same as or different from each other, and are each independently a divalent functional group, and
wherein the divalent functional group is an alkylene group having 35 to 100 carbon atoms; or a polysiloxanylene group having 5 to 100 carbon atoms:

[Chemical Formula 2]

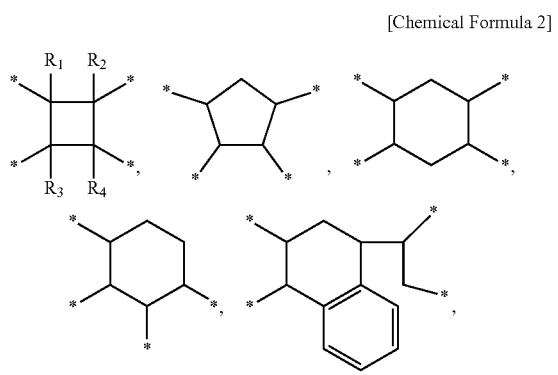

wherein, in the Chemical Formula 2, Y is any one selected from the group consisting of a direct bond, —O—, —CO—, —COO—, —S—, —SO—, —SO$_2$—, —CR$_7$R$_8$—, —(CH$_2$)$_t$—, —O(CH$_2$)$_t$O—, —COO(CH$_2$)$_t$OCO—, —CONH—, phenylene, and a combination thereof, wherein $R_1$ to $R_8$ are each independently hydrogen, or an alkyl group or a haloalkyl group having 1 to 10 carbon atoms, and t is an integer of 1 to 10.

2. The branched copolymer according to claim 1, wherein the polysiloxanylene group having 5 to 100 carbon atoms has a number average molecular weight of 100 g/mol to 1000 g/mol.

3. The branched copolymer according to claim 1, wherein the polyimide block includes a crosslinking functional group bonded to a polyimide backbone or branched chain.

4. The branched copolymer according to claim 3, wherein the crosslinking functional group is contained in an amount of 5% to 50% by weight based on the total weight of the branched copolymer.

5. The branched copolymer according to claim 1, wherein the polyimide block includes a polyimide repeating unit represented by Chemical Formula 3:

[Chemical Formula 3]

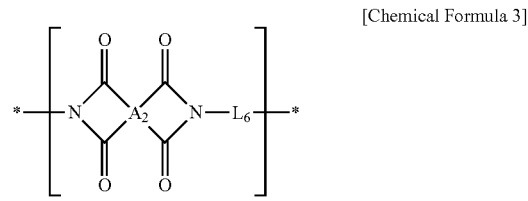

wherein. in the Chemical Formula 3,
$A_2$ is a tetravalent functional group, and
$L_6$ is a divalent functional group substituted by a haloalkyl group and a crosslinking functional group.

6. The branched copolymer according to claim 5, wherein the divalent functional group substituted by a haloalkyl group and a crosslinking functional group is represented by Chemical Formula 4:

[Chemical Formula 4]

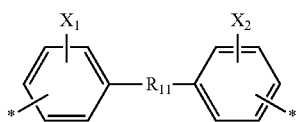

wherein, in the Chemical Formula 4, $R_{11}$ is an alkylene group substituted with a haloalkyl group, and at least one of $X_1$ and $X_2$ is a cros slinking functional group, and the remainder is hydrogen.

7. The branched copolymer according to claim 1, wherein the branched copolymer includes a copolymer represented by Chemical Formula 5 or a copolymer represented by Chemical Formula 6:

[Chemical Formula 5]

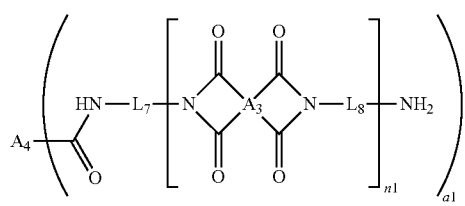

[Chemical Formula 6]

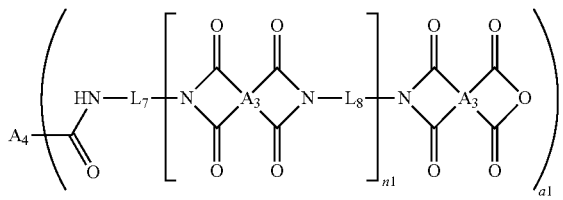

wherein in the Chemical Formulae 5 and 6, $A_4$ is $A_1$ as defined in claim 1, a1 is an integer of 4, $L_7$ is as defined as $L_2$ to $L_5$ in claim 1, $A_3$ is a tetravalent group, $L_8$ is a divalent functional group substituted by a haloalkyl group and a crosslinking functional group, and n1 is an integer of 1 to 10,000.

8. The branched copolymer according to claim 1, wherein the branched copolymer has a weight average molecular weight of 1000 glmol to 1,000,000 g/mol.

9. A photosensitive resin composition con rising the branched copolymer of claim 1.

10. A photosensitive resin film comprising a heat-cured product of the photosensitive resin composition of claim 9.

11. The photosensitive resin film according to claim 10, wherein a temperature for the heat-curing of the photosensitive resin film is 250° C. or less.

12. An optical device comprising the photosensitive resin film of claim 10.

* * * * *